(12) United States Patent
Wei et al.

(10) Patent No.: US 6,873,800 B1
(45) Date of Patent: Mar. 29, 2005

(54) HOT PLUGGABLE OPTICAL TRANSCEIVER IN A SMALL FORM PLUGGABLE PACKAGE

(75) Inventors: Cheng Ping Wei, Gilbert, AZ (US); Edwin D. Dair, Los Angeles, CA (US)

(73) Assignee: JDS Uniphase Corporation, San Jose, CA (US)

( * ) Notice: Subject to any disclaimer, the term of this patent is extended or adjusted under 35 U.S.C. 154(b) by 736 days.

(21) Appl. No.: 09/656,779

(22) Filed: Sep. 7, 2000

Related U.S. Application Data (63) Continuation-in-part of application No. 09/321,308, filed on May 27, 1999, and a continuation-in-part of application No. 09/320,409, filed on May 26, 1999.

(51) Int. Cl.[7] .............................................. H04B 10/00
(52) U.S. Cl. ........................................ 398/138; 385/14
(58) Field of Search ................................ 398/128, 130, 398/135, 138; 385/14, 31, 39, 40, 88, 92, 93, 94

(56) References Cited

U.S. PATENT DOCUMENTS

| | | |
|---|---|---|
| 3,792,284 A | 2/1974 | Kaelin |
| 3,809,908 A | 5/1974 | Clanton |
| 3,870,396 A | 3/1975 | Racki et al. |
| 3,976,877 A | 8/1976 | Thillays |
| 4,149,072 A | 4/1979 | Smith et al. |
| 4,161,650 A | 7/1979 | Caouette et al. |
| 4,229,067 A | 10/1980 | Love |
| 4,273,413 A | 6/1981 | Bendikens et al. |
| 4,347,655 A | 9/1982 | Zory et al. |
| 4,419,072 A | 12/1983 | Nakagawa et al. |
| 4,432,604 A | 2/1984 | Schwab |
| 4,446,515 A | 5/1984 | Sauer et al. |
| 4,449,244 A | 5/1984 | Kopainsky |
| 4,461,537 A | 7/1984 | Raymer, II et al. |
| 4,493,113 A | 1/1985 | Forrest et al. |

(List continued on next page.)

FOREIGN PATENT DOCUMENTS

EP 0 652 696 A1 11/1994

OTHER PUBLICATIONS

R.T. Chen and P.S. Gulfoyle (Eds.) Optoelectronic Interconnects and Packaging, Critical Reviews, vol. CR62 (1996), pp. 48–63, 64–67, 229–243, 393–404, 405–414, 442–460, Spic Optical Engineering Press, Washington.

(List continued on next page.)

Primary Examiner—Jason Chan
Assistant Examiner—Agustin Bello
(74) Attorney, Agent, or Firm—Allen, Kyer, Doppelt, Milbrath & Gilchrist, P.A.

(57) ABSTRACT

A fiber optic module for transferring data as pulses of light has an optical element with a first light transducer having a straddle mount lead and a second light transducer having a formed or bent signal lead. A first fiber optic receptacle optically couples to the first light transducer and a second fiber optic receptacle optically couples to a second light. A printed circuit board subassembly includes first and second printed circuit boards with an interconnection therebetween to couple to an electrical connector on the first. The first printed circuit board and second printed circuit boards are aligned so that the straddle mount leads couple to contacts on the first and the formed signal lead couple to contacts on the second. One or more electrical components in the fiber optic module process data for communication using light or photons over one or more optical fibers. An outer housing encloses the optical element subassembly and the printed circuit board subassembly. The electrical connector couples external electrical signals to the electrical components.

20 Claims, 6 Drawing Sheets

U.S. PATENT DOCUMENTS

| | | |
|---|---|---|
| 4,533,209 A | 8/1985 | Segerson et al. |
| 4,534,616 A | 8/1985 | Bowen et al. |
| 4,535,233 A | 8/1985 | Abraham |
| 4,539,476 A | 9/1985 | Donuma et al. |
| 4,542,076 A | 9/1985 | Bednarz et al. |
| 4,549,782 A | 10/1985 | Miller |
| 4,549,783 A | 10/1985 | Schmachtenberg, III |
| 4,553,811 A | 11/1985 | Becker, deceased et al. |
| 4,580,295 A | 4/1986 | Richman |
| 4,595,839 A | 6/1986 | Braun et al. |
| 4,612,670 A | 9/1986 | Henderson |
| 4,625,333 A | 11/1986 | Takezawa et al. |
| 4,647,148 A | 3/1987 | Katagiri |
| 4,678,264 A | 7/1987 | Bowen et al. |
| 4,720,630 A | 1/1988 | Takeuchi et al. |
| 4,727,248 A | 2/1988 | Meur et al. |
| 4,807,955 A | 2/1989 | Ashman et al. |
| 4,840,451 A | 6/1989 | Sampson et al. |
| 4,844,581 A | 7/1989 | Turner |
| 4,856,091 A * | 8/1989 | Taska ......................... 398/166 |
| 4,881,789 A | 11/1989 | Levinson |
| 4,897,711 A | 1/1990 | Blonder et al. |
| 4,912,521 A * | 3/1990 | Almquist et al. ........... 398/117 |
| 4,913,511 A | 4/1990 | Tabalba et al. |
| 4,945,229 A | 7/1990 | Daly et al. |
| 4,979,787 A | 12/1990 | Lichtenberger |
| 4,986,625 A | 1/1991 | Yamada et al. |
| 4,989,934 A | 2/1991 | Zavracky et al. |
| 5,005,939 A | 4/1991 | Arvanitakis et al. |
| 5,011,246 A | 4/1991 | Corradetti et al. |
| 5,039,194 A | 8/1991 | Block et al. |
| 5,043,775 A | 8/1991 | Lee |
| 5,093,879 A | 3/1992 | Bregman et al. |
| 5,099,307 A | 3/1992 | Go et al. |
| 5,104,243 A | 4/1992 | Harding |
| 5,109,453 A | 4/1992 | Edwards et al. |
| 5,109,454 A * | 4/1992 | Okuno et al. .................. 385/92 |
| 5,117,476 A | 5/1992 | Yingst et al. |
| 5,122,893 A | 6/1992 | Tolbert |
| 5,136,152 A | 8/1992 | Lee |
| 5,155,786 A | 10/1992 | Ecker et al. |
| 5,168,537 A | 12/1992 | Rajasekharan et al. |
| 5,202,943 A | 4/1993 | Carden et al. |
| 5,241,614 A | 8/1993 | Ecker et al. |
| 5,259,054 A | 11/1993 | Benzoni et al. |
| 5,280,191 A | 1/1994 | Chang |
| 5,285,512 A | 2/1994 | Duncan et al. |
| 5,289,345 A | 2/1994 | Corradetti et al. |
| 5,295,214 A | 3/1994 | Card et al. |
| 5,337,391 A | 8/1994 | Lebby |
| 5,337,396 A | 8/1994 | Chen et al. |
| 5,337,398 A | 8/1994 | Benzoni et al. |
| 5,345,524 A | 9/1994 | Lebby et al. |
| 5,361,244 A | 11/1994 | Nakamura et al. |
| 5,414,787 A | 5/1995 | Kurata |
| 5,416,668 A | 5/1995 | Benzoni |
| 5,416,870 A | 5/1995 | Chun et al. |
| 5,416,871 A | 5/1995 | Takahashi et al. |
| 5,416,872 A | 5/1995 | Sizer, II et al. |
| 5,428,704 A | 6/1995 | Lebby et al. |
| 5,432,630 A | 7/1995 | Lebby et al. |
| 5,434,747 A | 7/1995 | Shibata |
| 5,446,814 A | 8/1995 | Kuo et al. |
| 5,452,387 A | 9/1995 | Chun et al. |
| 5,455,703 A | 10/1995 | Duncan et al. |
| 5,462,630 A | 10/1995 | Murakami |
| 5,473,715 A | 12/1995 | Schofield et al. |
| 5,475,783 A | 12/1995 | Kurashima |
| 5,482,658 A | 1/1996 | Lebby et al. |
| 5,499,311 A | 3/1996 | DeCusatis |
| 5,499,312 A | 3/1996 | Hahn et al. |
| 5,515,468 A | 5/1996 | DeAndrea et al. |
| 5,519,190 A | 5/1996 | Aoki |
| 5,528,408 A * | 6/1996 | McGinley et al. .......... 398/139 |
| 5,535,296 A | 7/1996 | Uchida |
| 5,537,391 A | 7/1996 | Ishikawa |
| 5,546,281 A | 8/1996 | Poplawski et al. |
| 5,548,677 A | 8/1996 | Kakii et al. |
| 5,550,941 A | 8/1996 | Lebby et al. |
| 5,561,727 A | 10/1996 | Akita et al. |
| 5,596,663 A | 1/1997 | Ishibashi et al. |
| 5,636,298 A | 6/1997 | Jiang et al. |
| 5,687,267 A | 11/1997 | Uchida |
| 5,708,743 A | 1/1998 | DeAndrea et al. |
| 5,717,533 A | 2/1998 | Poplawski et al. |
| 5,734,558 A | 3/1998 | Poplawski et al. |
| 5,736,782 A | 4/1998 | Schairer |
| 5,751,471 A | 5/1998 | Chen et al. |
| 5,767,999 A | 6/1998 | Kayner |
| 5,774,614 A | 6/1998 | Gilliland et al. |
| 5,778,127 A | 7/1998 | Gilliland et al. |
| 5,812,582 A | 9/1998 | Gilliland et al. |
| 5,812,717 A | 9/1998 | Gilliland et al. |
| 5,864,468 A | 1/1999 | Poplawski et al. |
| 5,879,173 A | 3/1999 | Poplawski et al. |
| 6,061,493 A | 5/2000 | Gilliland et al. |
| 6,071,017 A | 6/2000 | Gilliland et al. |
| RE63,820 | 8/2000 | McGinley et al. |
| 6,369,924 B1 * | 4/2002 | Scharf et al. ............... 398/117 |

OTHER PUBLICATIONS

R.G. Hunsperger, Integrated Optics: Theory and Technology (2nd Ed.), 1985, pp. 89–106, 236–245, Springer–Verlag Berlin Heidelberg, Germany.

A. Chatak and K. Thyagarajan, Introduction to Fiber Optics, 1998, pp. 411–413, 447–449, 467–473, Cambridge University Press, United Kingdom.

R.C. Dorf, Electrical Engineering Handbook, 1993, pp. 1682–1684, CRC Press, Inc., Florida.

Buczynski, et al., Fast Optical Thresholding with an Array of Optoelectronic Transceiver Elements, IEEE Photonics Technology Letters, vol. 11, No. 3, Mar. 1999.

Heinrich, et al., Low–Cost VCSEL–Transceiver Module for Optical Data Busses, IEEE, 1997.

Rosinski, et al., Multichannel Transmission of a Multicore Fiber Coupled with Vertical–Cavity Surface–Emitting Lasers, Journal of Lightwave Tech., vol. 17, No. 5, May 1999.

Crow, et al., The Jitney Parallel Optical Interconnect, 1996 Electronic Components and Technology Conference.

* cited by examiner

HOT PLUGGABLE OPTICAL TRANSCEIVER IN A SMALL FORM PLUGGABLE PACKAGE

CROSS REFERENCE TO RELATED APPLICATIONS

This application claims the benefit and is a continuation-in-part of U.S. patent application Ser. No. 09/321,308, filed on May 27, 1999 by Wenbin Jiang et al having Attorney Docket No. 003918.P003 which is hereby incorporated by reference and also claims the benefit and is a continuation-in-part of U.S. patent application Ser. No. 09/320,409, filed on May 26, 1999 by Wenbin Jiang et al having Attorney Docket No. 003918.P002 which is hereby incorporated by reference, all of which are to be assigned to E20 Communications, Inc.

FIELD OF THE INVENTION

This invention relates generally to light coupling devices. More particularly, the invention relates to fiber optic modules.

BACKGROUND OF THE INVENTION

Fiber optic modules interface optical fibers to electronic circuitry transducing communication by light or photons with communication by electrical signals. A fiber optic module may be a fiber optic receiver, transmitter or transceiver including both receive and transmit functions. The fiber optic receiver, transmitter and transceiver each have optical elements (OE) and electrical elements (EE). The fiber optic transmitter OE includes an emitter (such as a semiconductor LED or Laser) mounted in a package and an optical coupling element for coupling light or photons from the OE into the optical fiber. The type of semiconductor laser (light amplification by stimulated emission of radiation) may be a vertical cavity surface emitting laser (VCSEL). The fiber optic receiver OE includes a photodetector (such as a photodiode) mounted in a package and an optical coupling element for coupling light or photons from the optical fiber into the photodetector. The EE for each includes integrated circuits, other active elements and passive elements mounted on a substrate such as a printed circuit board (PCB) or ceramic. The OE and EE are connected electrically at the emitter and photodetector.

Because many of the optical elements of fiber optic modules use plastic materials, the optical elements can not tolerate the high temperatures experienced during wave soldering. Thus, wave soldering of the fiber optic module printed circuit boards must be done before the optical elements are mounted to the printed circuit board. After wave soldering, the optical-elements are then mounted to the printed circuit board in a separate manufacturing step. The additional step thereby increases manufacturing costs. It is desirable to reduce manufacturing costs of fiber optic modules by reducing the number of manufacturing steps. It is desirable to wave solder fiber optic module printed circuit boards without necessitating separate manufacturing steps to mount the optical transmitters and optical receivers.

A new standard referred to as the Hot pluggable Gigabit Interface Converter (GBIC) has recently been introduced for fiber optic modules. The details of this new standard are set forth in SFF Committee Proposed Specification for GBIC (Gigabit Interface Converter), Rev. 5.4, Aug. 16, 1999, the disclosure of which is incorporated herein by reference. However, because GBICs are of a relatively large size, end users desire a more compact, high throughput fiber optic transceivers. Particularly, end users desire a GBIC in a small form pluggable (SFP), LC package. It is desirable to package the functions of a GBIC into the compact size of an SFP, LC package.

As end users become ever more reliant on digital optical network communication systems, short interruptions in fiber optic devices become more serious service problems. Thus a need exists to minimize down time of fiber optic modules by allowing the hot replacement of fiber optic modules, the optical elements, and/or the electrical elements of fiber optic modules.

Moreover, It is desirable to improve upon the prior art.

BRIEF SUMMARY OF THE INVENTION

Briefly, the present invention includes a method, apparatus and system as described in the claims.

A fiber optic transceiver module is implemented within a GBIC (Gigabit Interface Converter) package with LC receptacles. The fiber optic transceiver module is implemented with an optical element and an electrical element. The optical element includes an optical block holding light receivers, light transmitters, and lenses and aligns the lenses with fiber optic connectors inserted into the fiber optic receptacles. Fiber optic receptacles other than LC receptacles may be used such as SC, MT–RJ, or MU receptacles to provide an optical interface of the module to the fibers.

The electrical element is implemented with vertically stacked receiver and transmitter printed circuit boards. The use of separate vertically stacked printed circuit boards allows packaging the functions of a GBIC within an LC or other small form factor package. One of the printed circuit boards protrudes from the fiber optic module's outer housing, while the other printed circuit board is wholly contained by the outer housing.

The printed circuit board that protrudes from the outer housing includes a hot pluggable electrical connector. The hot pluggable electrical connector is a portion of the printed circuit board that protrudes from the outer housing, thereby allowing electrical coupling of the fiber optic module to other electrical data processing devices. Alternatively, when a hot plug-in application is not required, the fiber optic module may have a fixed electrical interface format it is directly soldered onto a daughter card or a system circuit board. Interconnect leads of the hot pluggable electrical connector electrically couple ground, power, and signals in to the traces of printed circuit board contained within the fiber optic module outer housing.

The separate, vertically stacked printed circuit boards are aligned with each other and the optical element by a top frame and a bottom frame. The frames may be formed of a conductive material such as a metal or other conductive material to provide electromagnetic interference (EMI) shielding. Straddle mount signal leads electrically couple the light receiver to the receiver printed circuit board. Formed (i.e. bent) signal leads electrically couple the light transmitter to the transmitter printed circuit board.

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

The present invention includes a method, apparatus and system for hot pluggable optical transceiver in a small form pluggable GBIC, LC type package.

Figure 1:
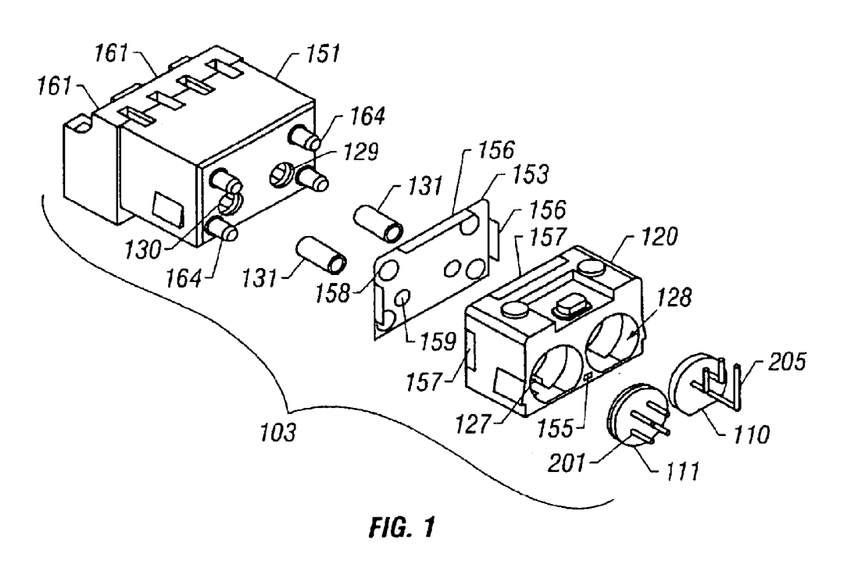
FIG. 1 is a simplified top—exploded view illustrating an optical element OE for an embodiment of the present invention.

Referring now to FIG. 1, an exploded view of the optical element 103 of an embodiment of the present invention is illustrated. The optical element 103 include a nose 151, a pair of fiber ferrule sleeves 131, an electromagnetic interference shield plate 153, the electromagnetic interference plate 153 provides shielding to keep electromagnetic interference from leaking into or out of the optical block 120 and the module. The optical block 120 aligns a light transmitter 110 and a light receiver 111 with two lenses in the optical block 120. The light transmitters 110 or light receivers 111 are optoelectronic devices for communicating with optical fibers using light of various wavelengths or photons. An optoelectronic device is a device which can convert or transduce light or photons into an electrical signal or an electrical signal into light or photons. In the case of transmitters, the light transmitters 110 are packaged emitters that can convert electrical signals into light or photons. Examples of emitters are semiconductor lasers (i.e. a VCSEL) or an LED which may be packaged in TO (transistor outline) cans. In the case of receivers, the light receivers 111 are packaged photodetectors, that detect or receive light or photons and convert it into an electrical signal An example of a photo detector is a photo diode which may be packaged in a TO can. However other packages, housings or optoelectronic devices for receiving and transmitting light or photons may be used for the light transmitters 110 or light receivers 111.

The electromagnetic interference plate 153 has one or more projections 156 which engage one or more external notches 157 of the optical block 120 near its edges. The optical ports 159 of the electromagnetic interference plate 153 align with a pair of optical ports 129 and 130 of the nose 151. The electromagnetic interference plate 153 is electrically coupled to an outer housing 400 (shown on FIG. 5) via the projections 156 and shunts electro—magnetic fields to the outer housing 400. The fiber ferules 131 can be inserted into the optical ports 129 and 130 upon assembly. The nose 151 further has one or more posts 164 over which one or more holes 158 in the electromagnetic interference plate 153 can slide in order to align the nose 151, the pair of fiber ferules 131, the electromagnetic interference plate 153 and the optical block 120 together.

The nose 151 has a pair of LC receptacles 161 for mechanically coupling and aligning a pair of fiber optic cables (not shown) into the fiber optic module 100. Each LC receptacle 161 is a fiber optic receptacle for one serial fiber optic channel. The LC receptacles 161 in the nose 151 are preferably located without spacing between each other. Neighboring channels are separated far enough apart that a fiber optic module 100 having multiple channels can comply with FDA and IEC Class—1 eye safety limits. This eases handling of the fiber optic module 100 by avoiding the use of eye protection.

Due to the size of LC receptacles, TO-can size packages are usable which allows the output power level of each individual fiber optic channel to be separately monitored. Monitoring a fiber optic channel involves splitting the light beam so that a photodetector or photodiode receives a portion of the light beam. The electrical output of the photodiode is then measured to indicate the output power level of the fiber optic channel. The relaxed spacing of the individual fiber optic receptacles of the present invention facilitate placing light beam splitters within the TO can of the light transmitter 110. The light beam splitter splits the beam such that a portion of the light beam lands on a photodiode within the TO can. The photodiode's output is measured to monitor the output power of the transmitter. Thus, with each channel being separately monitored for power output, each channel can be individually optimized. Those skilled in the art will also recognize that other fiber optic connectors such as, but not limited to, SC, MT—RJ, VF45, and MU connectors, may be used in lieu of the LC receptacles 161.

Figure 2:
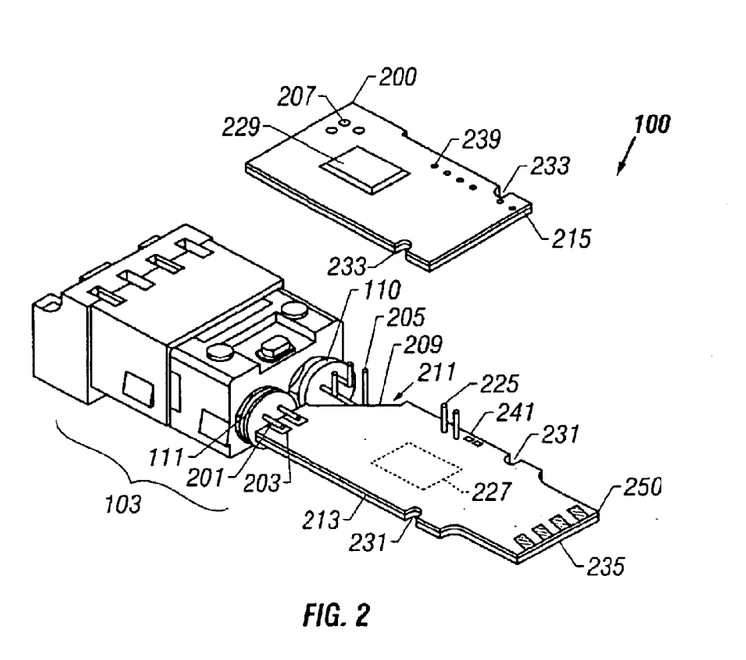
FIG. 2 is a partially assembled view of an optical element, receiver printed circuit board, and transmitter printed circuit board for an embodiment of the present invention.

Referring now to FIG. 2, a partially assembled view of an optical element 103, a receiver printed circuit board 250, and a transmitter printed circuit board 200 for an embodiment of the present invention is illustrated. Receiver printed circuit board 250 includes one or more receiver electrical components 227 (receiver integrated circuit (transimpedance amplifier and post amplifier), resistors, capacitors and other passive or active electrical components), a male electrical connector 235, and a receiver ground plane 213 (not shown). The transmitter printed circuit board 200 includes one or more transmitter electrical components 229 (transmitter integrated circuit (laser driver), resistors, capacitors and other passive or active electrical components) and a transmitter ground plane 215 (not shown). The receiver printed circuit board 250 and the transmitter printed circuit board 200 may be assembled by wave soldering.

At least one pin of the male electrical connector 235 couples to an external female electrical connector. The external female electrical connectors may be SFP (Small Form Pluggable) SMT (Surface Mount Technology) connectors. One or more pins of the male electrical connector 235 allow electrical signals, power, and ground to be coupled into or out of the fiber optic module 100.

Figure 3:
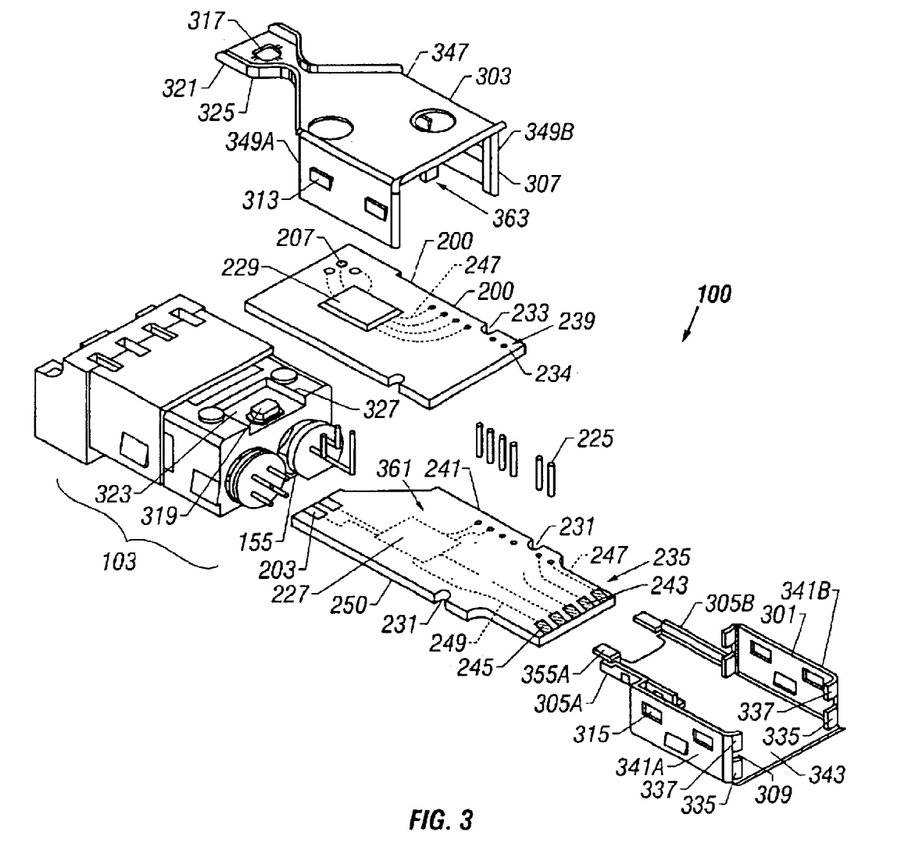
FIG. 3 is an exploded view of a printed circuit board cage subassembly and optical element of the present invention.

Referring now to FIG. 3, an exploded view of the optical element 103, the receiver printed circuit board 250, the transmitter printed circuit board 200, a bottom frame 301, and a top frame 303 is illustrated. One or more transmitter pins 243 of the male electrical connector 235 which couple to the transmitter electrical components 229, the transmitter electrical components 229, the light transmitter 110, the interconnect leads 225 and a lens (not shown) of the optical block form one transmitting channel. The transmitter electrical components 229 control the light transmitter 110 and buffer the data signal received from a system for transmission over an optical fiber. One or more receiver pins 245 of the male electrical connector 235 which couple to the receiver electrical components 227, the receiver electrical components 227, the light receiver 111 and a lens (not shown) of the optical block form one receiving channel. The receiver electrical components 227 control the light receiver 111 and buffer the data signal received from an optical fiber. Other combinations of components can form other combinations of communications channels.

The optical element 103 includes the light receiver ill with a plurality of straddle mount signal leads 201. The Straddle mount signal leads 201 are arranged in two horizontal rows to straddle a printed circuit board. The two rows of straddle mount signal leads 201 sandwich the receiver printed circuit board 250 so that the straddle mount signal leads 201 electrically couple the light receiver 111 to a plurality of receiver contacts 203 on both sides of the receiver printed circuit board 250. To improve the coupling between the straddle mount signal lead 201 and the receiver contacts 203, solder may be applied to the straddle mount signal leads 201 and the receiver contacts 203. The receiver contacts 203 are preferably a metal such as copper, silver, gold or other metal or alloy. The receiver contacts 203 may be on one or both the top and bottom surfaces of the receiver printed circuit board 250.

Optical element 103 has a light transmitter 110 with a plurality of formed (i.e. bent) signal leads 205. Each formed signal lead 205 is bent and turned up to couple to a header signal via 207, in the printed circuit board. The printed circuit board 250 has a cutout 209 that allows space for a horizontal portion of the formed signal lead 205. The cutout 209 may be at an angle cutting out a corner of receiver printed circuit board 250. In the alternative, the cutout 209 may be a square, semicircle, quarter circle or other shape. The vertical portion of each formed signal lead 205 is long enough to couple the light transmitter 110 to the transmitter printed circuit board 200.

The ends of formed signal leads 205 couple to a plurality of vias 207, through-holes, contacts or other coupling devices on the transmitter printed circuit board 200. To improve the coupling between a formed signal lead 205 and a via 207, solder may be applied to the formed signal lead 205 and the via 207. Since the printed circuit board assemblies and optical elements are mechanically coupled after the printed circuit boards have been wave soldered, the optical elements are not subject to the heat generated by wave soldering. While a 90 degree angle has been described, it is understood that other arrangements of the formed signal leads 205 may be employed to couple the light transmitter 110 to the transmitter printed circuit board 200.

When assembled into the fiber optic module, the receiver printed circuit board 250 and the transmitter printed circuit board 200 are vertically stacked and substantially parallel to each other. The top frame 303 and the bottom frame 301 hold the receiver printed circuit board 250 and the transmitter printed circuit board 200 in fixed vertical and horizontal alignment.

The fiber optic module further includes one or more interconnect leads 225 which electrically couple the transmitter electrical components 229 on the transmitter printed circuit board 200 to transmitter pins 243 of the electrical connector by means of signal traces in the receiver printed circuit board 250.

The receiver printed circuit board 250 includes a receiver ground plane 213 (shown in FIG. 2), and the transmitter printed circuit board 200 includes a transmitter ground plane 215 (shown in FIG. 2). Receiver ground plane 213 shunts electromagnetic fields radiating into it to ground via a pin in the male electrical connector 235. The transmitter ground plane 215 shunts electromagnetic fields radiating into ground through one or more of the interconnect leads 225, a transmitter trace 247 on the receiver printed circuit board 250, and a pin 243 in the male electrical connector 235.

The receiver printed circuit board 250 includes a pair of slots 231 (referred to as receiver slots 231) one in the left side edge and another in the right side edge of the printed circuit board as shown and illustrated in FIG. 2. The transmitter printed circuit board 200 includes a pair of slots 233 (referred to as transmitter slots 233) one in the left side edge and another in the right side edge of the printed circuit board as shown and illustrated in FIG. 2. The receiver slots 231 and the transmitter slots 233 facilitate alignment between the receiver printed circuit board 250 and the transmitter printed circuit board 200.

The bottom frame 301 includes a pair of sides 341A and 341B, a base 343, a pair of rails 305A and 305B, a plurality of lower support tabs 335 and a plurality of upper support tabs 337 extending from a pair of corners of each of the sides 341A and 341B as illustrated in FIG. 3. The base 343 of the bottom frame 301 is L shaped such that the rail 305B extends along the side and base of the bottom frame 301 while the rail 305B extends out of a center line (near the middle of the bottom frame) with a surface of the base therebetween. The L shape leaves a cutout area from the base of the bottom frame which will be filled in by a bottom cover as described below. The rail 305A extending from the center line or middle of the bottom frame 301, includes a tip 355A that extends outward and is inserted into an opening 155 in the optical block 120.

The top frame 303 includes a top 347, a pair of top frame sides 349A and 349B, a pair of alignment rails 307, and a flange 321 as shown and illustrated in FIG. 3.

When assembled, the receiver printed circuit board 250 is inserted into a pair of slots 309 between the upper support tabs and the lower support tabs and rests on the lower support tabs 335 of the bottom frame 301. A pair of receiver slots 231 in edges of the receiver printed circuit board 250 are located near corners of the sides 341A and 341B of the receiver printed circuit board. The four lower support tabs 335 and the four upper support tabs 337 restrict vertical movement in the receiver printed circuit board 250 when its engaged thereto. One or more of the elements of the bottom frame 301 may be formed of a conductive material such as a metal or formed to include a conductive plating or surface. The conductive material of the bottom frame 301 shunts electromagnetic fields to ground via an electrical coupling to chassis ground. In this manner the bottom frame 301 can provide electromagnetic interference shielding for the fiber optic module.

When assembled, the transmitter printed circuit board 200 rests on the four upper support tabs 337 of the bottom frame 301 such that the pair of transmitter slots 233 in the transmitter printed circuit board 200 are aligned directly above the pair of receiver slots 231 in the receiver printed circuit board 250 at a position adjacent to and above the upper support tabs 337. The alignment of the slots 233 with the slots 231 in each of the respective printed circuit boards assures that the transmitter interconnect vias 239 align with the receiver interconnect vias 241 such that the one or more interconnect leads 225 can be coupled therebetween. The one or more interconnect leads 225 couple the respective transmitter traces 247 in the transmitter printed circuit board 200 and the receiver printed circuit board 250 together. The interconnect leads 225 are soldered to the receiver printed circuit board 250 at the receiver interconnect vias 241 on one end and to the transmitter printed circuit board 200 at the transmitter interconnect vias 239 at an opposite end. Though the interconnect leads 225 have been described as providing electrical coupling between the receiver printed circuit board 250 and the transmitter printed circuit board 200, it is understood that other interconnect devices may be employed including ribbon cable, wires, male and female electrical connectors and the like.

The pair of top frame sides 349A and 349B of the top frame 303 engage with the bottom frame sides 341A and 341B of the bottom frame 301 respectively when they are assembled together. When assembled, external faces of the top frame sides 349 abut inside faces of bottom frame sides 341. Each of the top frame sides have a pair of locking tabs 313 which engage with a pair of lock tab apertures 315 in each of the bottom frame sides 341 to hold them together. The locking tabs 313 and the locking tab apertures 315 prevent the bottom frame 301 and the top frame 303 from moving vertically relative to each other. Each vertical edge of the top frame sides 349A and 349B mates with the upper tabs 337 and the lower tabs 335 to keep the top frame 303 from moving laterally relative to the bottom frame 301. The top frame 303 has the pair of alignment rails 307 on edges of the top frame sides 349A and 349B. The alignment rails 307 mate with the pair of transmitter slots 233 in the transmitter printed circuit board 200 and the pair of the receiver slots 231 in the receiver printed circuit board 250 to keep them in alignment so that the interconnect leads 225 are not sheared by movement in either and the electrical coupling is maintained. Top frame 303 has a tab 363, rib, post or other member on the underside of top 347. When top frame 303 is assembled to the bottom frame 301 and transmitter board 200, the tab 363 prevents upward movement of transmitter printed circuit board 200. Additionally, the pair of alignment rails 307 abut a pair of lower support tabs 335 and a pair of upper support tabs 337 to maintain alignment and avoid movement as stress is placed on the receiver printed circuit board 250 when the fiber optic module is pulled away from a connector. The top frame 303 includes the flange 321 which extends from the top 347 of the top frame 303 as shown and illustrated in FIG. 3. The flange 321 includes an opening 317 which slides over a top post 319 of the optical block 120 of the optical element 103. When the opening 317 of the flange 321 is mated with the top post 319, the top frame 303 is tightly coupled to the optical element 103 to avoid separation when the fiber optic module is inserted or removed from a connector. With the opening 317 engaged to the top post 319 so that the top frame is tightly coupled, the alignment rails 307 of the top frame 303 in conjunction with the receiver slots 231 and the transmitter slots 233, keep the receiver printed circuit board 250 and the transmitter printed circuit board 200 tightly coupled to the optical element 103 as well to avoid separation. The flange 321 includes a flange lip 325 that abuts a recess wall 327 of the optical block 120 to prevent lateral movement of the top frame 303 relative to the optical elements 103.

The top frame 303 includes a pair of top frame sides 349A and 349B and the top 347. These and other elements of the top frame may be formed of a conductive material such as a metal or formed to include a conductive plating or surface. The conductive material of the top frame 303 shunts electromagnetic fields to ground via an electrical coupling to chassis ground. In this manner, the top frame 303 provides electromagnetic interference shielding to the fiber optic module.

The assembled subassembly including the receiver printed circuit board 250, the transmitter printed circuit board 200, the interconnect leads 225, the bottom frame 301 and the top frame 303 can hereinafter be referred to as a printed circuit board assembly 411.

Figure 4A:
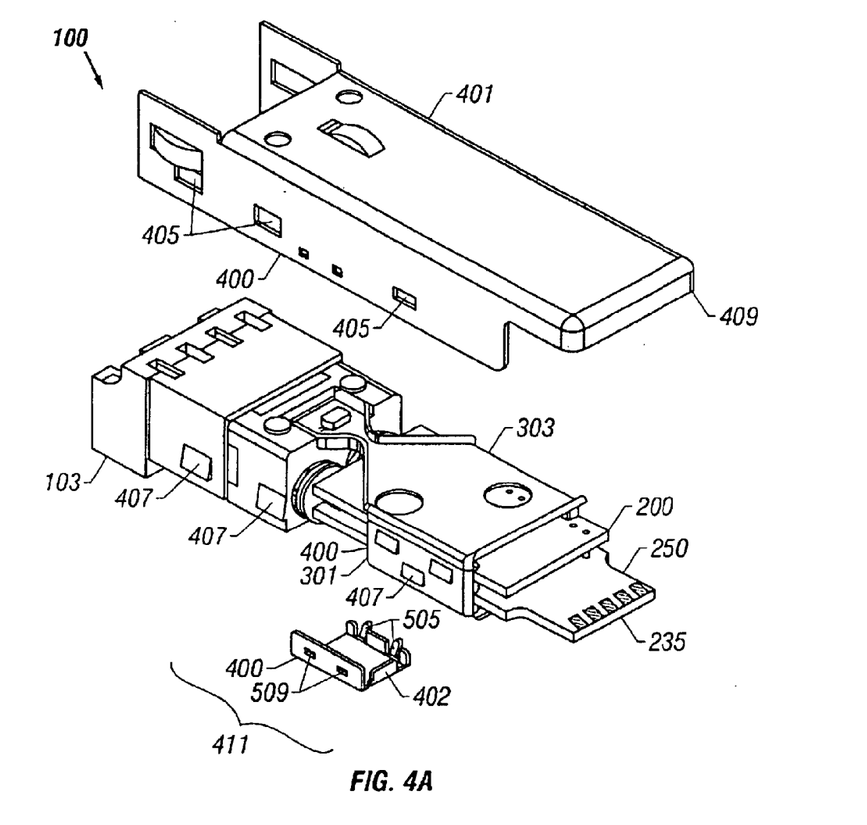
FIG. 4 is an exploded view for the rear of the hot pluggable fiber optic module of the present invention.

Referring now to FIG. 4A, an exploded view of an outer housing 400 and the printed circuit board assembly 411 is illustrated. The outer housing 400 includes a top cover 401, a bottom cover 402 and the L shaped bottom frame 301. The top cover 401, the bottom cover and the bottom frame 301 couple together to encase the receiver and transmitter printed circuit boards but for the extension in the receiver printed circuit board forming the male connector 235. The top cover 401 includes a top portion and a pair of sides that fit over the printed circuit board assembly 411 and the optical element 103. The top cover 401 includes a plurality of locating tab openings 405 in each of its sides to engage with locating tabs 407 in sides of the optical block 120, in the nose of optical element 103, and in the bottom frame 301. When the locating tab openings 405 are engaged with the locating tabs 407, movement of the top cover 401 relative to the optical element 103 is prohibited. The top cover 401 includes a hood 409 which encloses an end of the transmitter printed circuit board 200 but leaves the connector 235 of the receiver printed circuit board 250 exposed to connect to a connector. The male electrical connector 235 extends from the top cover 401 to mechanically and electrically couple to an external female electrical connector.

The bottom cover 402 is of sufficient size to fill into the cutaway area in the L shaped bottom frame 301. The bottom cover 402 couples to the bottom frame 301 on one side and the top cover 401 on an opposite side.

Figure 4B:
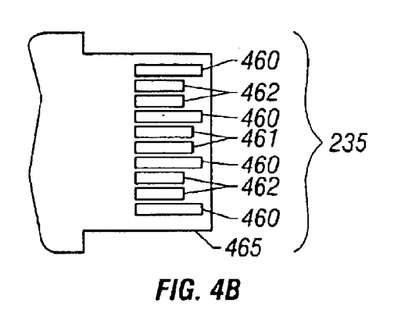
Figure 4C:
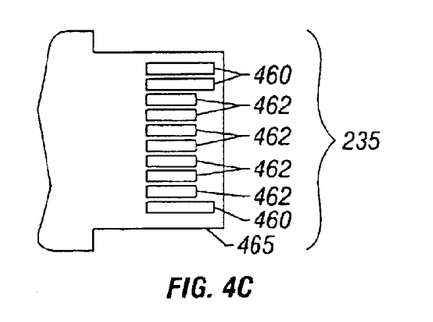

Referring now to FIGS. 4B and 4C, pins of the male electrical connector 235 are illustrated in detail to provide hot plugability. The male electrical connector 235 includes one or more ground or negative power pins 460, one or more positive power pins 461 and one or more signal pins 462 on top and/or bottom surfaces of the receiver printed circuit board 250. The pins 460, 461, and 462 are staggered from each other with reference to an edge 465 of the receiver printed circuit board 250 to facilitate the hot plugability. The ground pins 460 of the male electrical connector 235 are closer to the edge 465 than any other pin in the male electrical connector 235 in order for ground to be established first when the fiber optic module is inserted and for ground to be removed last when its removed. The positive power pins 461 are next closest to the edge 465 for power to be established secondly when the fiber optic module is inserted and for power to be removed next to last when its removed. The signal pins 462 are farther from the edge that the power pins 461 and ground pins 462 so that they are established after power and ground has been when inserted and they are disconnect first when the fiber optic module is removed.

During the mating of the male electrical connector 235 with an external female electrical connector, the ground pins electrically couple first to ground receptacles of the external female electrical connector in order to ground the fiber optic module 100. During the demating of the male electrical connector 235 and external female electrical connector, the ground pin electrically decouples from the ground last to maintain the grounding of the fiber optic module 100 until after power is removed from the fiber optic module 100. The ground pins 460 being closer to the edge 465 than the power pins 461 and the signal pins 462, prevents damage and disruption to the fiber optic module and the system during the physical insertion and removal of the fiber optic module into and out of the system. The capability to physically remove and insert the fiber optic module during operation without damage or disruption is referred to as hot pluggability.

The outer housing 400, including the top cover 401 and the bottom cover 402 and the bottom frame 301, may be formed of a conductive material such as a metal or include a conductive plating or surface. With the outer housing 400 formed out of a conductive material, the outer housing 400 can shunt electromagnetic fields radiating into the outer housing 400 to ground via an electrical coupling to chassis ground. In this manner the outer housing 400 also can provide electromagnetic interference shielding to the fiber optic module.

Figure 5:
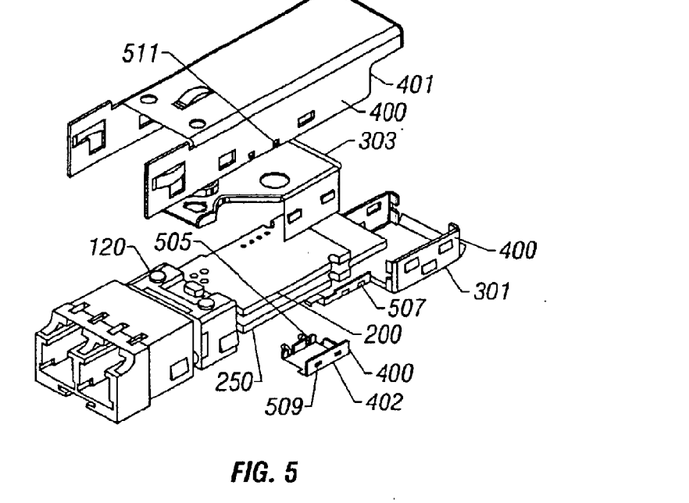
FIG. 5 is exploded view from the front of the fiber optic module of the present invention.

Referring now to FIG. 5, an exploded view of the fiber optic module 100 from the front is illustrated. The bottom cover 402 of the outer housing 400 includes a pair of tabs 509 on one side and a pair of projections 505 on an opposite side. The projections 505 of the one side engage a pair of holes 507 in a side of the rail 305A of the bottom frame 301. The projections 505 in the opposite side of the bottom cover 402 engage the housing holes 511 in a side of the top cover 401. The inside surface of the side of the top cover 401 couples to the outer surface of the side of the bottom cover 402 when the tabs 509 are mated with the housing holes 511.

The bottom cover 402 can be readily disassembled and reassembled with the top cover 401 and the bottom frame 301 of the fiber optic module 100. By removing the bottom cover 402, a portion of the receiver printed circuit board is exposed to allow access to adjust adjustable electrical components (not shown) on the receiver printed circuit board 250. The adjustable electrical components electrically couple to the electrical components 227 on the receiver printed circuit board 250. The adjustable electrical components electrically couple to the electrical components 229 by way of a conductive path through one or more transmitter traces 361 on the receiver printed circuit board 250, the interconnect vias 225, and the transmitter traces 247 on the transmitter printed circuit board 200. The adjustable electrical components may include DIP switches, potentiometers, variable capacitors and other devices used to tune or adjust the performance of the fiber optic module 100.

The bottom cover 402 can also be formed of a conductive material such as a metal or include a conductive plating or surface which is coupled to chassis ground (via holes 507, housing holes 511 and tabs 505 and projections 509) in order to provide electromagnetic interference shielding for the fiber optic module 100.

Figure 6A:
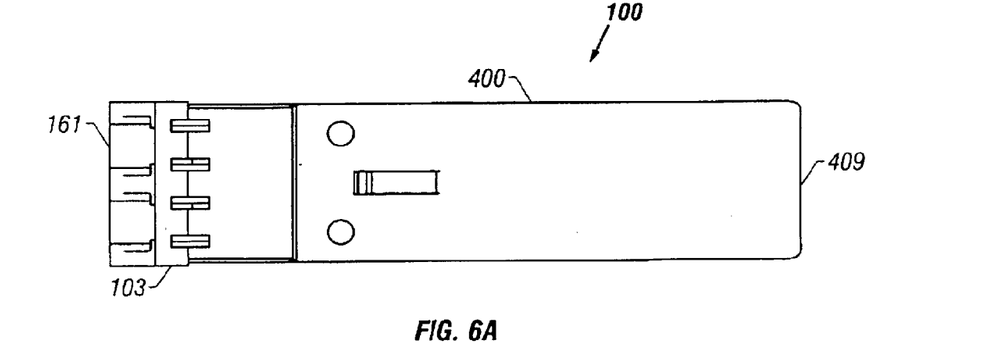
FIG. 6A is a top view of the assembled fiber optic module.
Figure 6B:
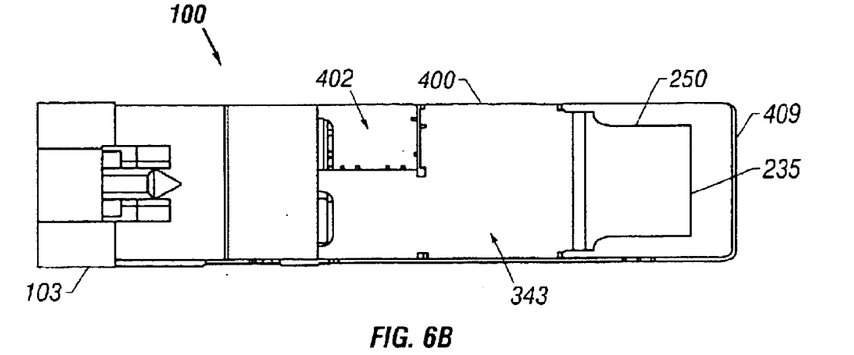
FIG. 6B is a bottom view of the assembled fiber optic module.
Figure 6C:
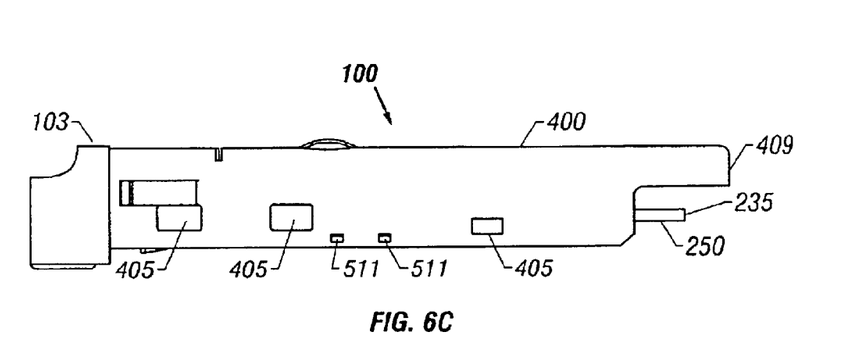
FIG. 6C is a right side view of the assembled fiber optic module.
Figure 6D:
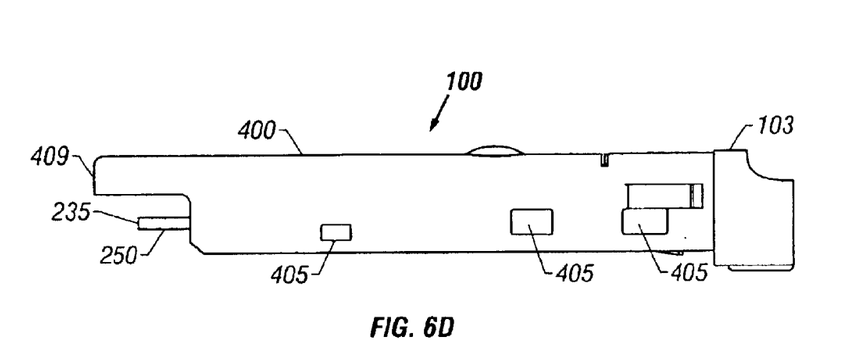
FIG. 6D is a left side view of the assembled fiber optic module.
Figure 6E:
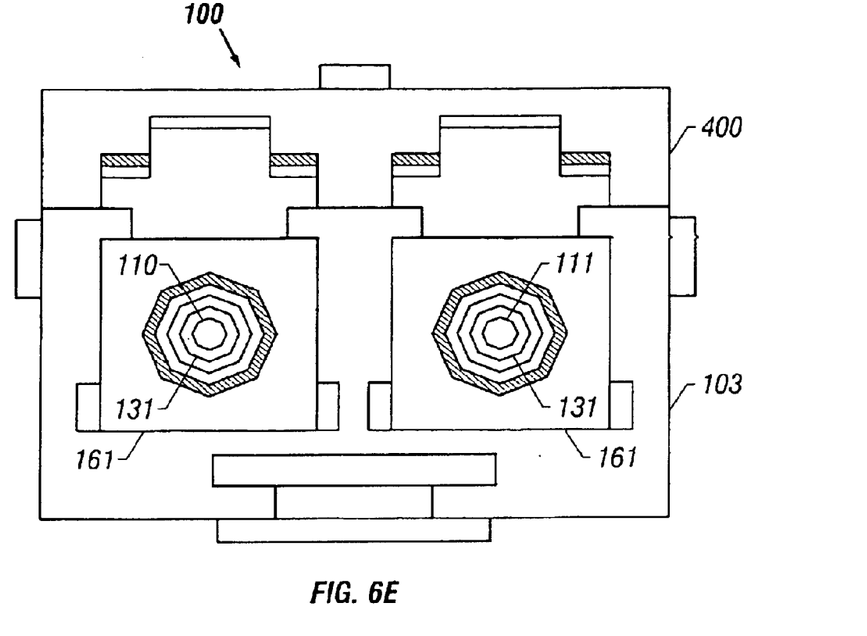
FIG. 6E is a front view of the assembled fiber optic module.
Figure 6F:
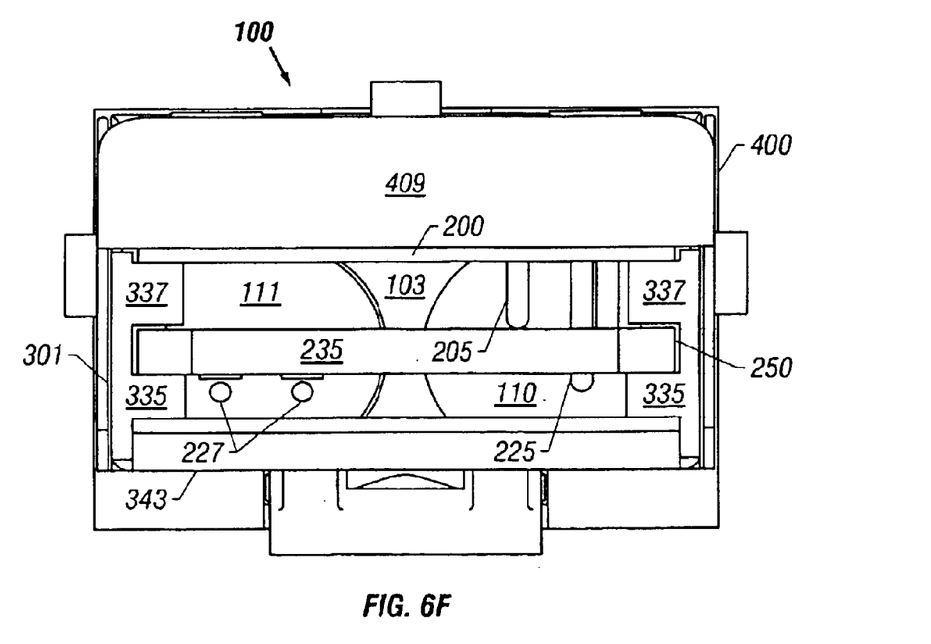
FIG. 6F is a rear view of the assembled fiber optic module.

FIG. 6A illustrates a top view of a fully assembled fiber optic module 100. FIG. 6B illustrates a bottom view of a fully assembled fiber optic module 100. FIG. 6C illustrates a right side view of a fully assembled fiber optic module. FIG. 6D illustrates a left side view of a fully assembled fiber optic module. FIG. 6C illustrates a front view of a fully assembled fiber optic module. FIG. 6D illustrates a rear view of a fully assembled fiber optic module. To assemble the fiber optic module 100 of the present invention, the receiver printed circuit board 250 is first slid into the slots 309 of the bottom frame 301 between the upper support tabs 337 and the lower support tabs 335 until the receiver slots 231 are adjacent to, and just inside an end of the bottom frame 301. When receiver printed circuit board 250 is properly positioned in the bottom frame 301, receiver electrical components 227 are face down, the ground plane is face up and the male electrical connector 235 extends beyond the end of the bottom frame 301 so that its external thereto.

Next, the one or more interconnect leads 225 are then press fit into the receiver interconnect vias 241. Solder is applied to the interconnect leads 225 at the receiver interconnect vias 241.

Then the transmitter interconnect vias 239 of the transmitter printed circuit board 200 are aligned with the one or more interconnect leads and press fit together so that the transmitter printed circuit board rests on top of the upper support tabs 337. With proper orientation, the ground plane is facing down toward the receiver printed circuit board while the transmitter electrical components 229 are on the face up side on the surface of the transmitter printed circuit board 200 and opposite the receiver printed circuit board 250. After press fitting them together, solder is applied to the interconnect leads 225 at the transmitter interconnect vias 239.

The top frame 303 is next in the assembly process. The alignment rails 307 of the top frame 303 are aligned with the transmitter slots 233 and the receiver slots 231. The alignment rails 107 are inserted into the transmitter slots 233 so that external surfaces of the sides 349A and 349B slide into the internal surfaces of the sides 341A and 341B respectively. The top frame 303 is coupled to the bottom frame such that the alignment rails 107 slide through the transmitter slots 233 and the receiver slots 231 until the locking tabs 313 engage with the lock tab apertures 315 to lock the top frame 303 in place relative to the bottom frame 301.

The optical elements 103 are prepared in parallel with forming the printed circuit board assembly 411. A die (not shown) is used to bend the signal leads of the light transmitter 110 through 90 degrees to form the formed signal leads 205 of the present invention. The optical elements are then assembled and aligned together as a subassembly.

The printed circuit board subassembly 411 is then coupled together to the optical elements subassembly. The printed circuit board subassembly 411 is positioned with the optical elements so that the receiver contacts 203 of the receiver printed circuit board 250 align with the space between the horizontal rows of straddle mount signal leads 201. The flange 321 of the top frame 303 is flexed upward so that the opening 317 can mate with the post 319. The printed circuit board subassembly and optical element 103 are brought together so that the receiver contacts 203 can electrically be couple to the straddle mount signal leads 201 and the tip 355A slides into the opening 155. The flange 321 is then released so that the opening 317 slides over the top post 319 to secure the printed circuit board subassembly 411 to the optical element subassembly 103.

Next the outer housing 400 is completed around the printed circuit board subassembly 411. The top cover 311 is aligned with the printed circuit board subassembly 411 so that the locating tab openings 405 can mate with the locating tabs 407. The top cover 401 is slid over the optical element subassembly 103 and the printed circuit board subassembly 411 so that the locating tabs 407 snap into the locating tab openings 405.

The bottom cover 402 is then couple to the bottom frame 301 and the top cover 401. The bottom cover is tilted so that the projections 505 engage the holes 507 in the side of the rail of the bottom frame 301. Then, the top cover 402 is pressed upward so that the tabs 509 engage with the housing holes 511 so that the bottom cover 402 is secured in place to complete the assembly of the fiber optic module 100.

For transmitting signals, the fiber optic module 100 electrically functions such that external electrical transmitter signals arriving at transmitter pins 243 in the male electrical connector 235 are coupled into the transmitter traces 247 routed on the receiver printed circuit board 250. The transmitter traces 247 couple the external electrical transmitter signal from the transmitter pins 243 to the receiver interconnect vias 241. The receiver interconnect vias couple the transmitter signals to the one or more interconnect leads 225. The one or more interconnect leads 225 couple the electrical signals from the receiver interconnect vias 241 at one end into the transmitter interconnect vias 239 at an opposite end. The transmitter traces 247 on the transmitter printed circuit board 200 couple the electrical signals from the transmitter interconnect vias 239 into the transmitter electrical components 229 and/or the transmitter 110. The transmitter electrical components 229 process the electrical signals into electrical transmission pulses for coupling to the light transmitter 110. The light transmitter 110 transduces the electrical transmission pulses into light pulses for transmission over the fiber optic cables.

For receiving signals, the fiber optic module 100 electrically functions such that external light pulses arriving at the LC receptacles 161 are transduced into electrical pulses by the light receiver 111 for coupling into the receiver electrical components 227. The receiver electrical components 227 process the electrical pulses into electrical receiver signals which are coupled to the receiver traces 249 of the receiver printed circuit board. The receiver traces 249 couple the receiver signals to the receiver pins 245 in the male electrical connector 235 by which the electrical receiver signals are coupled to external devices. In one embodiment of the present invention, one electrical component on one of the printed circuit boards controls both the light transmitter 110 and the light receiver 111.

In operation, the fiber optic module 100 may be housed in a rack or a cabinet designed to house an LC, GBIC package. When the fiber optic module 100 is inserted into the rack the male electrical connector 235 couples to a female electrical connector of the rack or cabinet. As the electrical connectors couple, one or more ground pins in the male electrical connector 235 electrically couples to one or more corresponding ground receptacles in the female electrical connector before any other pin electrically couples. One or more power pins in the male electrical connector 235 electrically couple to one or more corresponding power receptacles in the female electrical connector before any signal pins electrically couple. After the ground and power pins have coupled, one or more signal pins may then electrically couple to one or more corresponding signal receptacles. Either before or after the fiber optic module is inserted into the rack, fiber optical cables (not shown) are connected to the LC receptacles 161.

When it is desired to replace the fiber optic module 100 for some reason, the present invention allows hot pluggable replacement. First the fiber connector is removed from the fiber optical module 100. Then the module is disconnected from any electrical connector into which it is coupled. As it is disconnected, the signal pins decouple first, the power pins second and the ground pins last. After which a new fiber optical module 100 can be inserted with the connecting sequence occurring as discussed above.

After the fiber optic module is disconnected, the optical element subassembly or the printed circuit board subassembly may be easily replaced. To replace the optical element 103, the flange 321 is flexed up to demate the opening 317 and the top post 319. The optical subassembly is then pulled away from the printed circuit board assembly 411. As the optical subassembly is pulled away from the printed circuit board assembly 411, the straddle mount signal leads 201 decouple from the receiver contacts 203. The formed signal leads 205 also decouple from the header signal vias 207. A replacement optical subassembly is then coupled to the printed circuit board assembly 411 as discussed above. After which the fiber optical module 100 (the replacement optical element 103 coupled to the printed circuit board assembly 411) can be inserted with the connecting sequence occurring as discussed above.

To replace the printed circuit board assembly 411, the optical fiber optic module is removed as discussed above, except that the fiber optic cables need not be removed from the LC receptacles 161. The flange 321 is flexed up to demate the opening 317 and the top post 319. The optical element 103 is then pulled away from the printed circuit board assembly. As the printed circuit board assembly 411 is pulled away from the optical element 103, the straddle mount signal leads 201 decouple from the receiver contacts 203. The formed signal leads 205 also decouple from the header signal vias 207. A replacement printed circuit board assembly 411 is then coupled to the optical element 103 as discussed above. After which the fiber optical module 100 (the optical element 103 coupled to the replacement printed circuit board assembly 411) can be inserted with the connecting sequence occurring as discussed above.

The previous detailed description describes the fiber optic module 100 as including one receiver and one transmitter. However, one of ordinary skill can see that the fiber optic module 100 may include two or more combinations of vertically stacked receivers, or transmitters, or receivers and transmitters. One embodiment of the present invention includes four vertically stacked transmitters. Another embodiment includes four vertically stacked receivers. Yet another embodiment includes a combination of four vertically stacked transmitters and receivers.

Furthermore, as one of ordinary skill can see, the positions of the receiver printed circuit board 250 and the transmitter printed circuit board 200 may be reversed. In this embodiment of the present invention, the transmitter printed circuit board 200 has the cutout 209 creating a distance 211 for the formed signal leads 205 of the light receiver 111. The formed signal leads 205 of the light receiver 111 couple to the header signal vias 207 on receiver printed circuit board 250. The straddle mount signal leads 201 of the light transmitter 110 couple to contacts on the transmitter printed circuit board 200. In this embodiment, the electrical components 227 and 229 are on opposite surfaces of the printed circuit boards 250 and 200 so that the ground planes 213 and 215 provide electromagnetic shielding to the electrical components 227 and 229.

In another embodiment of the present invention, the transmitter printed circuit board 200 includes the male electrical connector 235. Receiver traces 249 of the transmitter printed circuit board 200 couple receiver pins 245 of the male electrical connector 235 to the interconnect vias 225. The interconnect vias 225 couple the receiver traces 249 of the transmitter printed circuit board 200 to receiver traces 249 of receiver printed circuit board 250 for coupling to receiver electrical components 227. The transmitter printed circuit board 200 also includes a portion that protrudes from the outer housing 400 and that includes the male electrical connector 235, thereby allowing the male electrical connector 235 to couple to an external female electrical connector.

As those of ordinary skill will recognize, the present invention has many advantages over the prior art. One advantage of the present invention is that each channel can be separately monitored for power output and therefore individually optimized. Another advantage of the present invention is that spacing provided between fiber optic channels eases the attachment of heatsinks. Another advantage of the present invention is that the receiver printed circuit board and transmitter printed circuit board may be wave soldered without over heating the optical elements or components. Additionally, the present invention allows the hot replacement of either the optical element, the electrical element, or the entire fiber optic module. Moreover, the fiber optic module of the present invention provides these advantages while conforming to the GBIC de facto standard.

The preferred embodiments of the present invention are thus described. While the present invention has been described in particular embodiments, the present invention should not be construed as limited by such embodiments, but rather construed according to the claims that follow below.

What is claimed is:

1. A fiber optic module-comprising:
   a first printed circuit board having a first contact and a second contact near an edge and a first via, the second contact coupled to the first via;
   a first light transducer coupled to the first printed circuit board and electrically connected to the first contact;
   a second printed circuit board, vertically stacked and parallel to the first printed circuit board, having a second via aligned with the first via in the first printed circuit board;
   an interconnect coupled to the first via of the first printed circuit board at one end and the second via of the second printed circuit board at an opposite end, the interconnect to couple signals between the first printed circuit board and the second printed circuit board;
   a second light transducer coupled to the second printed circuit board and electrically connected to the second contact; and
   an electrical connector formed on an edge said first printed circuit board for plugging into a mating connector on a system circuit board, whereby a first pin on said electrical connector is electrically connected to said first light transducer, via said first printed circuit board, and a second pin on said electrical connector is electrically connected to said second light transducer, via the second printed circuit board, the interconnect and the first printed circuit board;
   wherein the second light transducer has an optical axis parallel to an optical axis of the first light transducer; and
   wherein the optical axes of the first and second light transducers define a plane, which is parallel to the first and second printed circuit boards.

2. The fiber optic module of claim 1, wherein the first printed circuit board includes a third contact and a fourth contact near the edge, the first, second, third and fourth contacts being staggered from the edge of the first printed circuit board to provide hot pluggability.

3. The fiber optic module of claim 2, wherein the first, second, third and fourth contacts are staggered from the edge of the first printed circuit board such that the fourth contact is nearest the edge and couples to ground or a negative power supply and the third contact is the next nearest to the edge and couples to a positive power supply and the first and second contacts are equally the farthest from the edge to couple to signals.

4. The fiber optic module of claim 1, wherein the first printed circuit board and the second printed circuit board are substantially parallel to each other and are substantially parallel to optical axes of the first light transducer and the second light transducer to conserve space.

5. The fiber optic module of claim 1, wherein
   the first printed circuit board has a first ground plane,
   the second printed circuit board has a second ground plane, and
   the first printed circuit board and the second printed circuit board are substantially parallel to each other with the first ground plane and the second ground plane facing each other to reduce electrical cross talk.

6. The fiber optic module of claim 1, further comprising:
   an optical block including,
      a first opening to receive and align the first light transducer, and
      a second opening to receive and align the second light transducer.

7. The fiber optic module of claim 1, wherein the first light transducer has a plurality of straddle mount leads for straddling the first printed circuit board;
   wherein the second light transducer has a plurality of formed signal leads; and
   wherein the first printed circuit board has a cutout section enabling the formed signal leads to extend to the second printed circuit board.

8. A fiber optic module comprising:
   a first printed circuit board having a first contact and a second contact near an edge, and a first via, the second contact coupled to the first via, the first printed circuit board having a first slot on an edge;
   a first light transducer coupled to the first printed circuit board and electrically connected to the first contact;
   a second printed circuit board having a second via aligned with the first via in the first printed circuit board, the second printed circuit board has a second slot on an edge;
   an interconnect coupled to the first via of the first printed circuit board at one end and the second via of the second printed circuit board at an opposite end, the interconnect to couple signals between the first printed circuit board and the second printed circuit board;
   a second light transducer coupled to the second printed circuit board and electrically connected to the second contact;
   a top frame having an alignment rail, the alignment rail to engage into the first slot substantially perpendicular to the first printed circuit board and the second slot substantially perpendicular to the second printed circuit board, the top frame to hold the first printed circuit board and the second printed circuit board in alignment together;
   a bottom frame coupled to the top frame, the bottom frame having: upper support tabs and lower support tabs forming a slot therebetween, and an opening to couple to a tab in the top frame to hold the top and bottom frames in alignment together;
   wherein the first printed circuit board is engaged into the slot between the upper support tabs and the lower support tabs; and
   wherein the second printed circuit board is engaged between the upper support tabs and an inner surface of a top of the top frame.

9. The fiber optic module of claim 8, further comprising:
an optical block including,
   a first opening to receive and align the first light transducer,
   a second opening to receive and align the second light transducer, and
   a post;
and wherein the top frame includes an opening to couple to the post of the optical block to align and hold the first printed circuit board, the second printed circuit board and the optical block coupled together.

10. A fiber optic module comprising:
a first printed circuit board having a first contact and a second contact near an edge, and a first via, the second contact coupled to the first via;
a first light transducer coupled to the first printed circuit board and electrically connected to the first contact;
a second printed circuit board having a second via aligned with the first via in the first printed circuit board;
an interconnect coupled to the first via of the first printed circuit board at one end and the second via of the second printed circuit board at an opposite end, the interconnect to couple signals between the first printed circuit board and the second printed circuit board;
a second light transducer coupled to the second printed circuit board and electrically connected to the second
a bottom frame having upper support tabs to support the first printed circuit board and lower support tabs to support the second printed circuit board, and
a top cover having a top and a pair of sides coupled to the bottom frame encasing the first and second printed circuit boards but for a portion of the first printed circuit board to expose the first and second contacts
wherein the bottom frame is L shaped having a cutout to expose a portion of the first printed circuit board in order to allow access thereto; and
wherein the fiber optic module further comprises a bottom cover to couple to the bottom frame on one side and the top cover on the opposite side, the bottom cover to seal the cutout in the bottom frame and encase the first and second printed circuit boards but for the portion of the first printed circuit board to expose the first and second contacts.

11. The fiber optic module of claim 10, wherein the bottom frame and the top cover are formed of a conductive material to shunt electromagnetic interference to ground.

12. The fiber optic module of claim 10, wherein the first printed circuit board includes an tunable circuit to tune the performance of the fiber optic module and the cutout allows access thereto when the bottom cover is disassembled from the fiber optic module.

13. The fiber optic module of claim 10, wherein the bottom frame, the top cover, and the bottom cover are formed of a conductive material to shunt electromagnetic interference to ground.

14. A fiber optic module for transferring data as pulses of light, comprising:

an optical element including:
   a first light transducer having a plurality of straddle mount leads,
   a second light transducer having a plurality of formed signal leads,
a printed circuit board assembly including:
   a first printed circuit board having a first set of contacts on opposite sides thereof, and
   a second printed circuit board having a second set of contacts, the second printed circuit board being vertically stacked, parallel and electrically connected to the first printed circuit board,
   said first and second printed circuit boards being aligned so that said straddle mount leads straddle said first printed circuit board and are coupled to said first contacts, and so that said formed signal leads are coupled to said second contacts; and,
an electrical connector extending from said first printed circuit board to couple electrical signals between a system circuit board and said first printed circuit board and said second printed circuit board;
wherein the second light transducer has an optical axis parallel to an optical axis of the first light transducer;
wherein the optical axes of the first and second light transducers define a plane, which is parallel to the first and second printed circuit boards; and
wherein the first printed circuit board has a cutout section enabling the formed signal leads to extend to the second printed circuit board.

15. The fiber optic module of claim 14, further comprising an outer housing for supporting the first and second printed circuit boards; wherein said electrical connector is hot pluggable, protrudes outside of said outer housing, has a first pin electrically coupled to said first printed circuit board, and has a second pin electrically coupled to said second printed circuit board.

16. The fiber optic module of claim 14, wherein said first light transducer is a light receiver.

17. The fiber optic module of claim 16, wherein said second light transducer is a light transmitter.

18. The fiber optic module of claim 14, further comprising LC receptacles.

19. The fiber optic module of claim 14, wherein said optical element and said printed circuit board assembly are a GBIC package.

20. The fiber optic module of claim 14, wherein:
the first printed circuit board has a first ground plane,
the second printed circuit board has a second ground plane, and
the first printed circuit board and the second printed circuit board are substantially parallel to each other with the first ground plane and the second ground plane facing each other to reduce electrical cross talk.

* * * * *